May 20, 1941. N. E. LINDENBLAD Re. 21,807

FREQUENCY CONTROL

Original Filed March 30, 1935 5 Sheets-Sheet 1

INVENTOR.
NILS E. LINDENBLAD

BY H. S. Grover

ATTORNEY.

FREQUENCY CONTROL

Original Filed March 30, 1935 5 Sheets-Sheet 2

INVENTOR.
NILS E. LINDENBLAD

BY H. S. Grover
ATTORNEY.

FREQUENCY CONTROL

Original Filed March 30, 1935 5 Sheets-Sheet 3

INVENTOR.
NILS E. LINDENBLAD

BY H. S. Grover

ATTORNEY.

INVENTOR.
NILS. E. LINDENBLAD
BY
H. S. Grover
ATTORNEY.

FREQUENCY CONTROL

Original Filed March 30, 1935 5 Sheets-Sheet 5

INVENTOR.
NILS E. LINDENBLAD

BY H. S. Grover
ATTORNEY.

Reissued May 20, 1941 Re. 21,807

UNITED STATES PATENT OFFICE 21,807

FREQUENCY CONTROL

Nils E. Lindenblad, Port Jefferson, N. Y., assignor to Radio Corporation of America, a corporation of Delaware Original No. 2,143,891, dated January 17, 1939, Serial No. 13,886, March 30, 1935. Application for reissue December 21, 1940, Serial No. 371,182

63 Claims. (Cl. 179—171.5)

My present invention relates to frequency modulation of short radio waves. While my frequency modulation scheme is generally applicable to any form of short wave oscillation generator, it is particularly useful for line controlled oscillation generators. The line controlled generator which I prefer to use is one making use of a section of hollow metallic tubing of predetermined length which acts as a low loss frequency determining circuit. More detailed descriptions of such line controlled apparatus may be found in my copending application Serial No. 6,814, filed February 16, 1935 now Patent No. 2,095,990 dated October 19, 1937; in the copending application of C. W. Hansell, Serial No. 692,092, filed October 4, 1933 now Patent No. 2,095,980 dated October 19, 1937; and in the copending applications of F. H. Kroger, Serial No. 1,489, filed January 12, 1935 and Serial No. 5,058, filed February 5, 1935 now Patent No. 2,077,880 dated April 20, 1937.

Frequency modulation of these line controlled oscillators may be accomplished by actually changing the physical dimensions of the frequency controlling line as, for example, associating therewith a mechanically vibrating capacitive element which is caused to vibrate at a desired modulation frequency. This scheme suffers from the disadvantage that the range of frequency variation produced in the high frequency oscillator is relatively small, and the change in frequency with modulation voltage is not always linear. Moreover, the mechanically vibrating scheme may introduce an undesirable amount of amplitude modulation. It is also very limited as to frequency of modulation in that it is not fast enough for such modulation as that used in television, for instance.

To overcome these difficulties is the principal object of my present invention and in effecting it, I feed back a certain amount of energy from the output of the oscillator to its frequency controlling circuit. The phase and amplitude of the energy fed back is, however, varied by the modulating waves, as a consequence of which the capacity or inductance or both of these characteristics of the frequency controlling circuit is so varied that linear frequency modulation over a very wide range, much wider than the absolute frequency values of the modulating waves, is obtained. A particular advantage of my present invention resides in the fact that no moving parts are required, and further advantages are found in the freedom from amplitude modulation and in the linear change in the frequency of the high frequency waves with respect to the modulating waves, potentials or currents.

Figure 1:
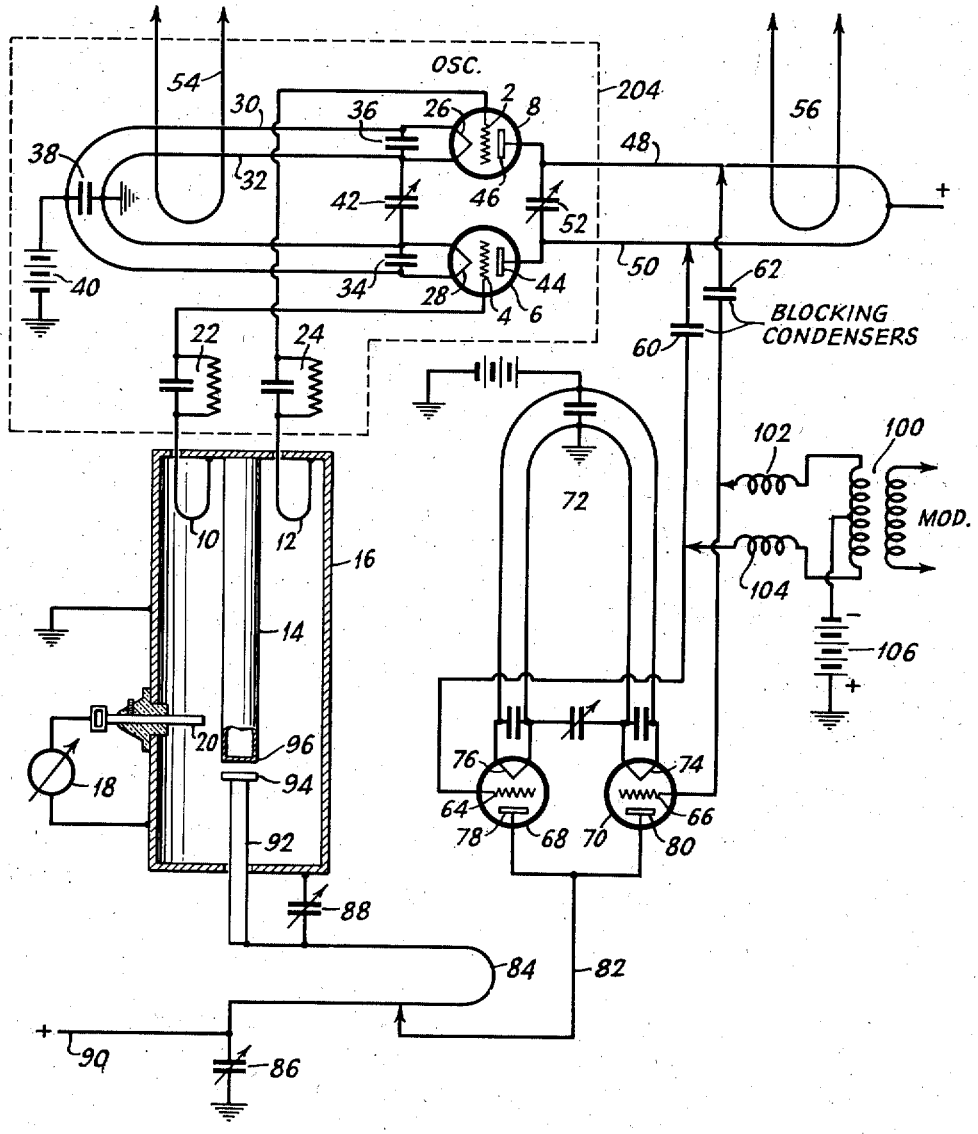
Figure 2:
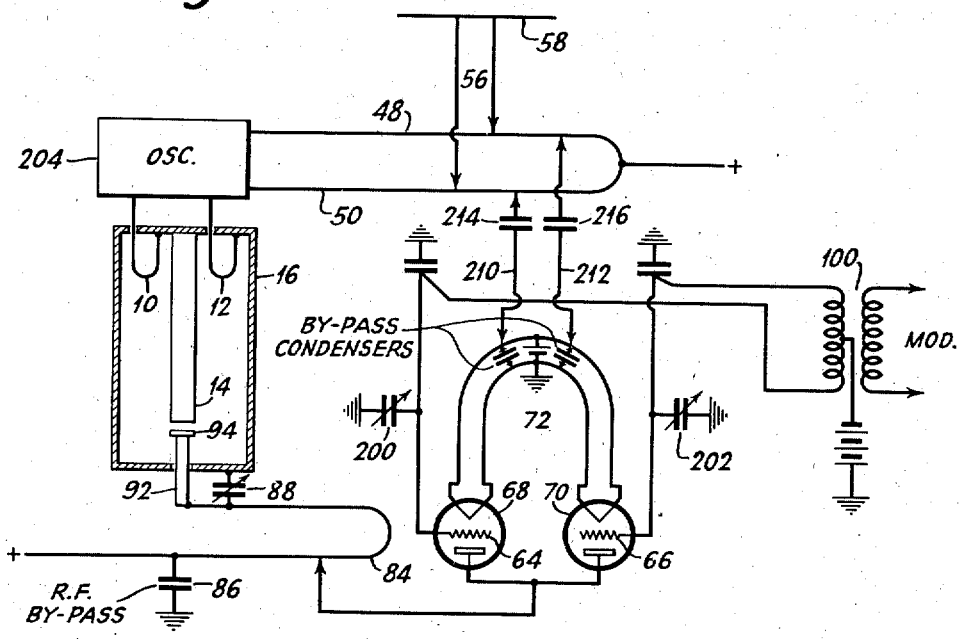
Figure 3:
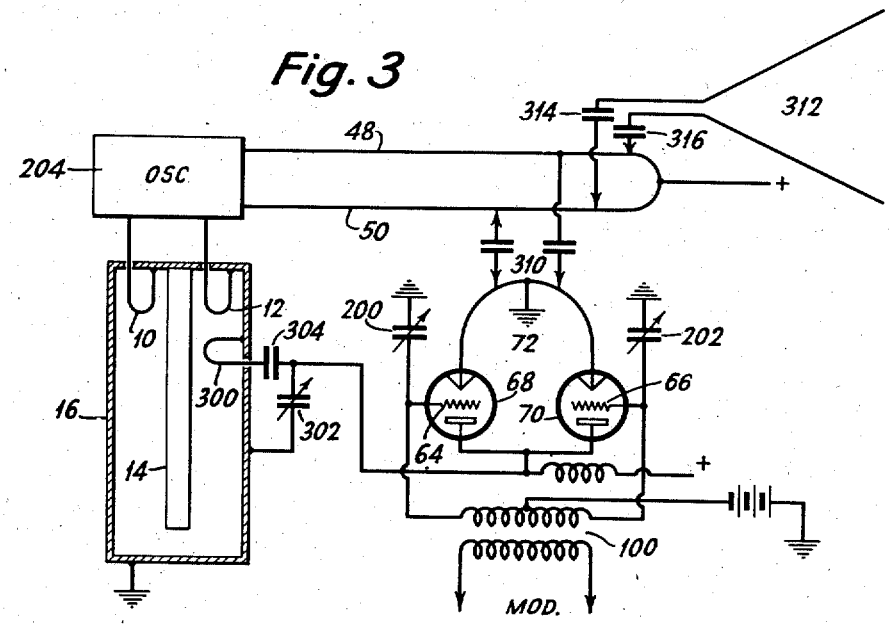
Figure 4:
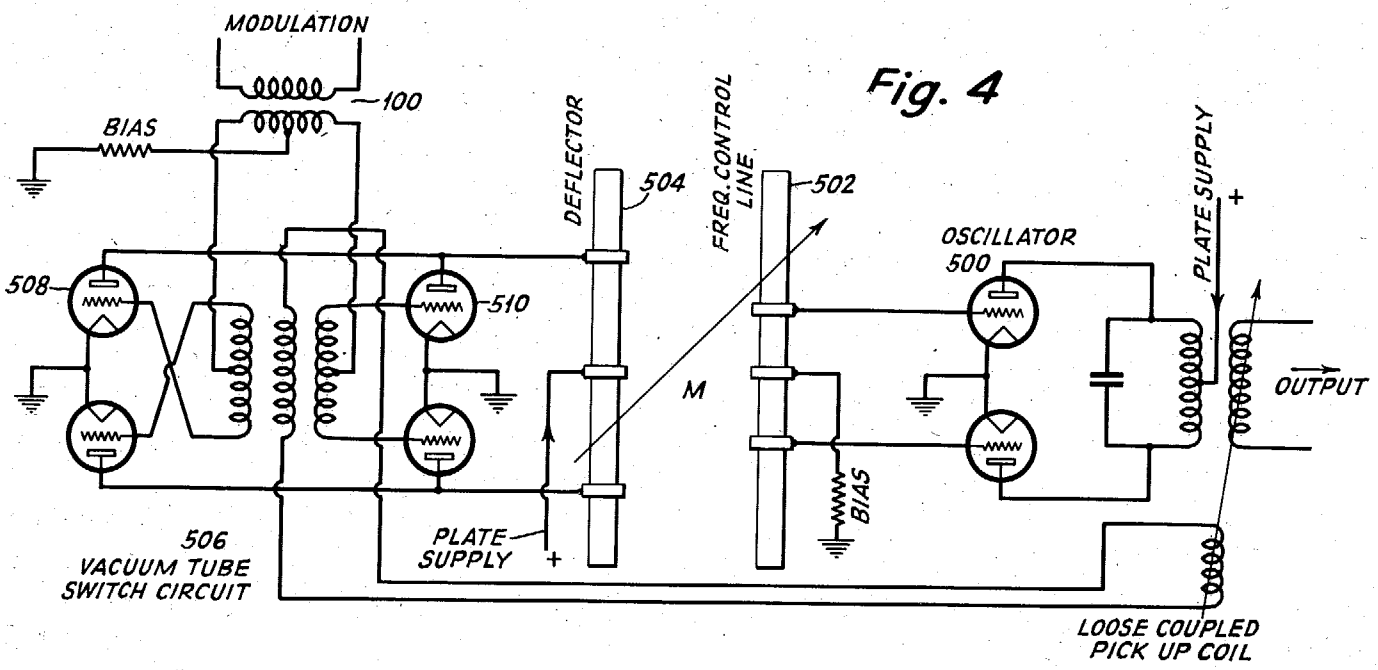
Figure 5:
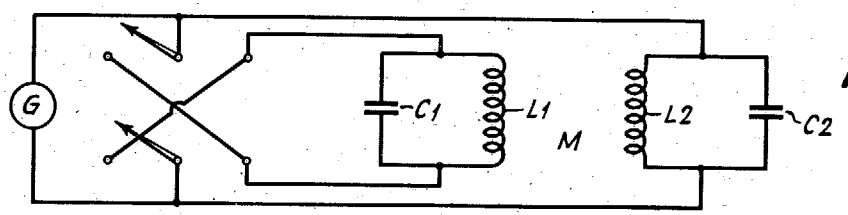
Figure 6:
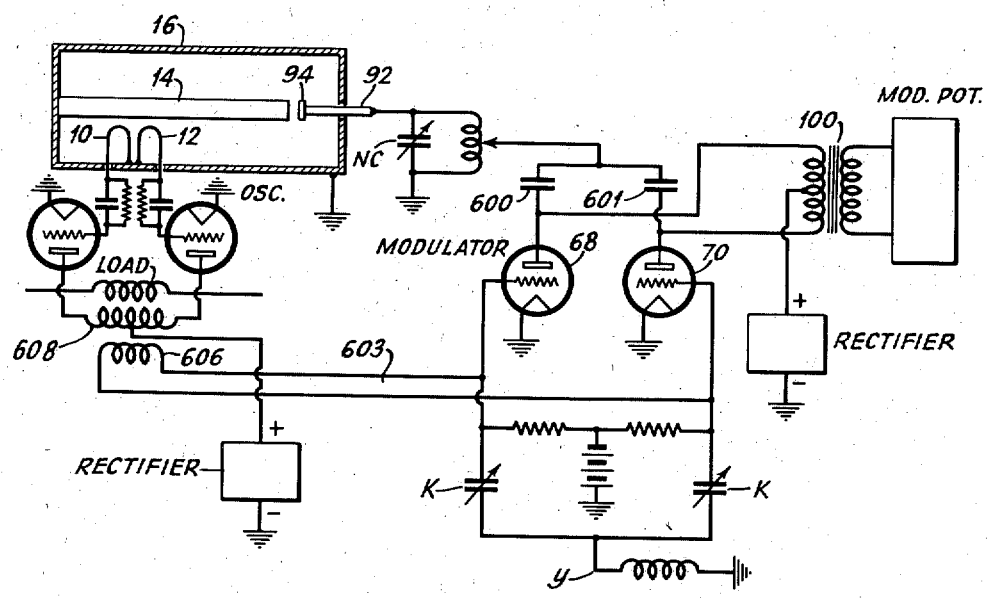
Figure 7:
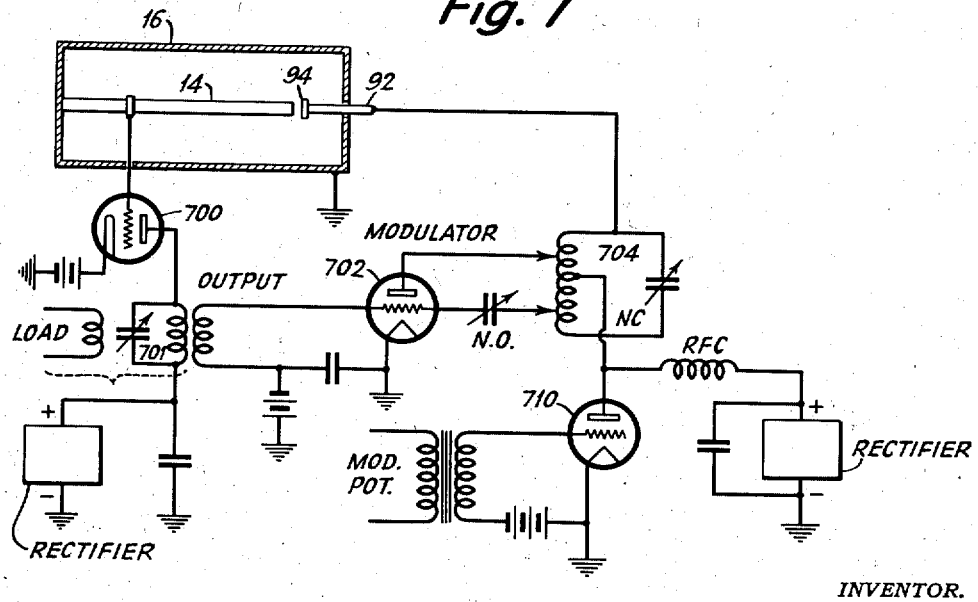
Figure 8:
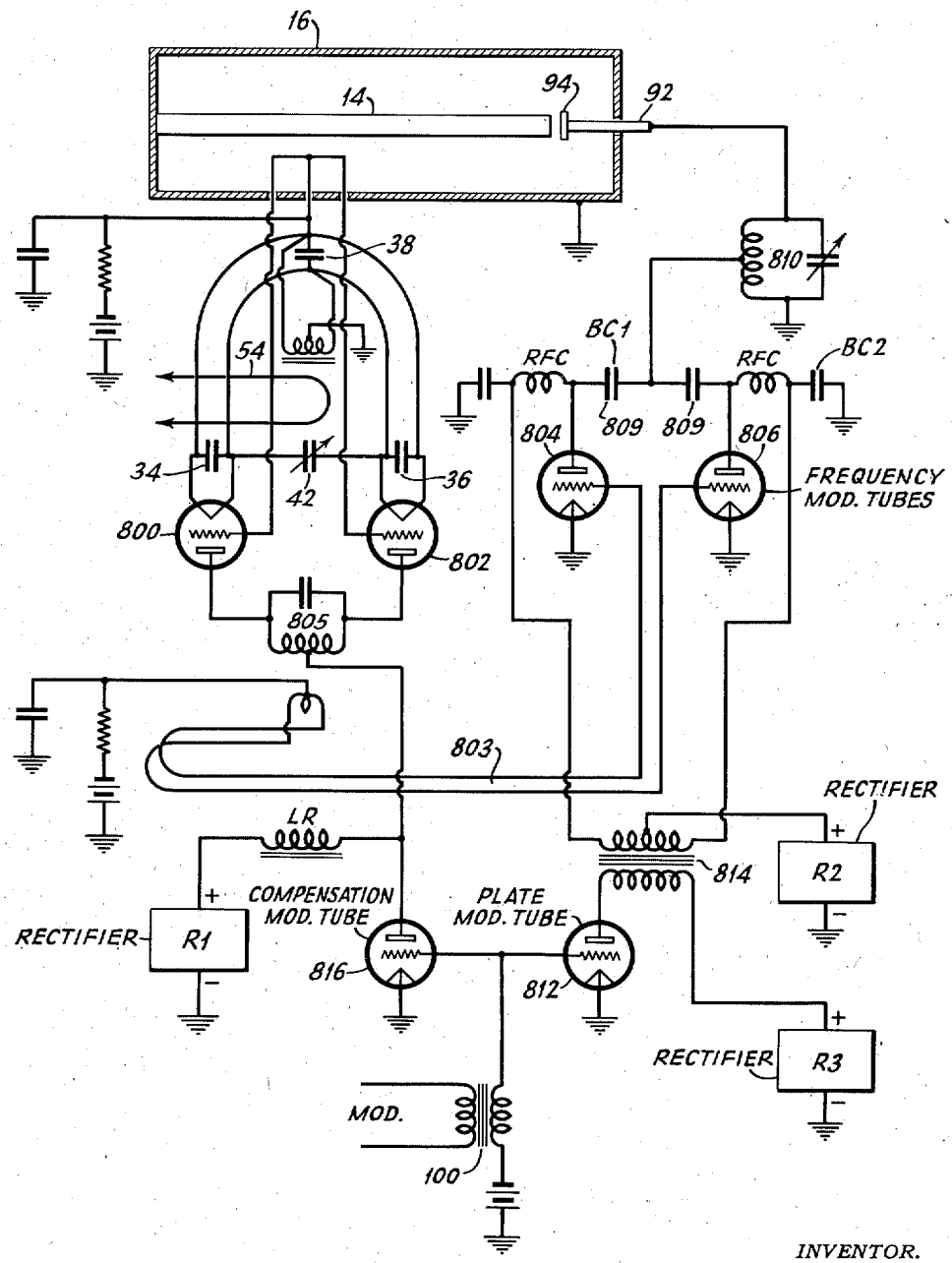

In the accompanying drawings, which are only illustrative of my present invention, and which are not to be considered in any way limitative thereof, Figure 1 illustrates a high frequency oscillator, a frequency control circuit and a modulator coupled to said oscillator and to said frequency control circuit to control the character thereof, and to frequency modulate the produced wave; Figure 2 illustrates a modification in which the grids of the modulator tubes are grounded to eliminate certain undesired capacity effects; Figure 3 is a modification wherein the inductance of the frequency controlling circuit is controlled; Figure 4 is another modification in which the inductance and capacity of a frequency controlling circuit are simultaneously varied by means of the phase and amplitude controlled feed-back energy; Figure 5 is a circuit explanatory of Figure 4. Figures 6 and 7 illustrate modifications of the arrangements of Figures 1 and 2 wherein the controlling potentials are applied to the plates of the modulator tubes; while Figure 8 is a modification which includes means for compensating for undesired modulation due to modulation power variations which may occur under some conditions.

Turning to Figure 1, the grids 2, 4 of the push-pull connected oscillation generator vacuum tubes 6, 8, are coupled through the loops 10, 12 in phase opposition with each other to the quarter wave frequency controlling line 14 concentrically mounted within the outer grounded metallic cylinder 16. The frequency controlling line system 14, 16 is preferably substantially ¼ the length of the waves to be generated as has been more fully described in the copending applications of F. H. Kroger hereinabove referred to, and may be of the type described by Kroger in that the cylinder or tube 14 is made substantially invariable in length despite ambient temperature changes. In fact, as a further precaution to insure frequency stability, the entire line controlling system 14, 16 may be housed within a constant temperature oven, not shown. The method of coupling the push-pull connected tubes 6, 8 in phase opposition to a quarter wave length line is more fully described and claimed in my copending application Serial No. 7,473, filed February 21, 1935. For determining proper operation of the system, the thermogalvanometer 18, capacitively coupled by the metallic stud 20 to the free end or high potential end of line 14, is provided. This measuring system is described and claimed more fully in my copending application Serial No. 6,814, filed February 16, 1935 now Patent No. 2,095,990 dated October 19, 1937. Grid bias for the grids 2, 4 is obtained by means of the grid leak and condenser connections 22, 24.

The cathodes 26, 28 are connected together in parallel for heating currents by means of conductors 30, 32, which act cophasally for high frequency currents. This cophasal action is enhanced by means of bypassing condensers 34, 36, 38. The filament system or the cathode heating system may be structurally made as shown in my copending applications Serial No. 651,809, filed January 14, 1933 now Patent No. 2,052,888 dated September 1, 1936 and Serial No. 603,310, filed April 5, 1932 now Patent No. 2,052,576 dated September 1, 1936, and are energized by the filament heating source 40. If desired, a variable condenser 42 may be provided for adjusting the filament or cathode impedance. The plates 44, 46 of the oscillator tubes 6, 8 are connected in phase opposition through the loop circuit 48, 50 which may be made adjustable in length and tuned to the operating frequency. To assist in this adjustment a variable condenser 52 may be provided. Output energy from the oscillator may be taken from the loop 54 coupled to the cathode system or may be taken inductively from the loop 56 coupled to the anode circuit 48, 50, 52.

Voltage from the output of 6 and 8 is fed through blocking condensers 60, 62 to the grids 64, 66 of the coupling and modulating tubes 68, 70. The condensers 60 and 62 are connected to points of opposed polarity on the lines 48 and 50 so that potentials displaced substantially 180° in phase are impressed on the grids of tubes 68 and 70. The filament circuit 72 for the cathodes 74, 76 of the tubes 68, 70 may be made identical to that of the oscillator tubes 6, 8 and hence need not be described in detail. The plates 78, 80 of tubes 68, 70 are connected together as shown and through conductor 82 to the loop 84 tuned by means of condensers 86, 88 which, though not essential, are helpful for adjustment purposes. Plate potential for tubes 68, 70 is supplied through lead 90. The loop 84 is connected to the metallic stud 92, provided with a capacity element or plate 94 adjacent, and preferably facing the high voltage end 96 of the quarter wave length line 14 which preferably is made hollow and cylindrical. The stud 92 may be insulatingly supported within the metallic cylinder 16 in a manner similar to the insulating support shown for stud 20, but this insulating support has been omitted for the sake of drawing clarity.

Modulating voltages are applied through the transformer 100 and radio frequency chokes 102, 104 in phase opposition to the grids of the tubes 68, 70, grid bias being fed through the secondary of the transformer 100 from the grid biasing source 106. Preferably the tubes 68, 70 are both biased to operate near the lower end of their characteristic curve. The modulating waves fed through the transformer 100 may be of audio frequencies or may be super-audible frequency waves or low radio frequency waves, as found desirable or useful.

By virtue of the phase opposition connection of the grids 64, 66 of the modulating tubes 68, 70, and the bias on said grids the phase of the energy fed back to the capacity stud 94 is varied or reversed in accordance with reversals of the modulating waves or potentials fed to the transformer 100. The amplitude of the modulating waves, which is also variable, also controls the amount of energy fed back to the modulating tubes. Hence, by virtue of this differential biasing scheme, the capacity element or stud 92, 94 carries potential of reversible phase and of varying amplitudes with respect to the end 96 of the frequency controlling line 14. These potentials of varying phase and varying amplitude oppose or add to the potentials on the stud as the relative phases of the original energy and energy fed back changes to an extent dependent upon the amplitude of the voltages fed back. Hence, there is a variation in the distribution of the electric flux from the end of the line in accordance with the modulating voltages in transformer 100 and this is equivalent to a variation in the capacity at the end of the line 14. This variation in capacity changes the natural period of the line 14 and hence the frequency of operation of the oscillator tubes 6, 8. The variation in frequency will be found to occur linearly over an extremely wide range depending upon the adjustments of the circuits used, and it will be found that the frequency modulated waves produced in the output circuits 54, 56 of the oscillator are remarkably free of amplitude modulation.

In the arrangement shown in Figure 1, some difficulty may be experienced due to capacitive coupling phenomena through the interelectrode capacities of the modulating tubes 68, 70. This may be avoided by using neutralizing circuits such as described in my copending application Serial No. 8,447, filed February 27, 1935, now Patent No. 2,101,438 dated December 7, 1937.

Often, however, this objectionable capacitive phenomena is avoided by grounding the grids 64, 66 for radio frequency currents by means of the condensers 200, 202 of Figure 2. The condensers 200, 202 are adjusted so as to series tune the inductance of the leads to 64, 66 and maintain them at ground radio frequency potential. The remaining portions of Figure 2 have been shown more or less diagrammatically and correspond in general to the apparatus shown in Figure 1. Condenser 86 of Figure 2, however, is made relatively large so as to maintain one end of the loop 84 grounded. The oscillator of Figure 2 is shown within the rectangle 204 and contains all of the apparatus within the dash lines 204 of Figure 1. The output circuit 56 of Figure 2 is shown conductively connected to the output conductors 48, 50 and the output is illustrated as being directly used in a short wave antenna 58. Also, an important difference of the scheme shown in Figure 2 resides in the fact that the high frequency input to the modulator tubes 68, 70 is applied to the tuned cathode circuit 72 through the conductors 210, 212 connected to the oscillator output conductors 48, 50 through the coupling condensers 214, 216. In the system shown in Figure 2, three hundred thousand cycle frequency variation was linearly produced about a carrier of a frequency of 200 megacycles per second. This is a particularly wide band of frequency modulation and was obtained without accompanying amplitude modulation. Although theoretically a small amount of amplitude variation should occur, it was found that the amplitude modulation was too small to be noticeable in practice.

In the system shown in Figure 3, the inductance of the line 14 is varied by coupling thereto the loop 300 which is tuned by means of condenser 302 and blocked off from plate potential by means of the coupling condenser 304. The inductance of the line 14 is opposed or aided, depending upon the relative phases of the potentials fed back and the potentials of the line wave, an extent dependent upon the amplitude of the potential fed back. If desired, of course, condenser 304 may be omitted, in which case the cylinder 16 would have to be insulated from ground rather than grounded as shown. Modulating waves, as shown, are fed through the transformer 100 to the grids 64, 66 which are grounded for radio frequency currents by means of bypass condensers 200, 202. As in Figure 2, the voltage feed back for frequency modulation purposes is fed into the cathode circuit 72 of the modulator tubes 68, 70 through the transmission line 310. Output energy of Figure 3 may be fed to a directive antenna 312 connected to the output conductors 48, 50 through the coupling condensers 314, 316.

At this point, attention may be called to the fact that one particular advantage of the foregoing system of frequency modulation is that the tuning of the coupling tube circuit, that is to say, the modulation tube circuit, may be made as broad as needed without adversely affecting the power factor of the frequency controlling circuit 14, 16. In addition, the power which the coupling tubes 68, 70 are required to handle is also very small as they are only required to affect a very small portion of the total oscillating power in the frequency controlling circuit, in the case shown, the line controlled system 14, 16. Since tuning of the stud circuit increases the impedance of said circuit and results in high mutual energy transfer from stud to line and from line to stud, due to enhanced unity power factor feed conditions, this stud circuit is often operated somewhat out of tune with the frequency of the system.

In Figures 1 to 3 the capacity or inductance of the frequency controlling circuit for an oscillation generator was varied in order to vary the frequency of oscillation in accordance with the modulating waves. In the scheme shown in Figure 4, both the capacity and inductance of a frequency controlling line are varied by the phase and amplitude controlled feed back.

For a better understanding of the system shown in Figure 4, reference is made to the schematic diagram shown in Figure 5. Turning to Figure 5, the generator G delivers power to the two tuned circuits $C_1$, $L_1$, and $C_2$, $L_2$. These two circuits are coupled to each other and have a mutual inductance M. By means of the switch connected as shown the phase of one of the circuits can be reversed with respect to the other. Because of this reversal of phase and due to the fact that the circuits have mutual reactance, the natural period of the combination will be different for the two positions of the switch and will also vary with respect to the amount of current drawn by each circuit.

With the foregoing principles in mind, the system of Figure 4 may readily be understood. The oscillator 500 of Figure 4 is frequency controlled by a frequency controlling resonant transmission line 502 one half wave length long. The oscillator 500 is more fully described in my copending application Serial No. 6,814, filed February 16, 1935 now Patent No. 2,095,990, dated October 19, 1937. A portion of the oscillator output is fed through the loosely coupled pickup coil to the vacuum tube switching circuit 506 which replaces the switch S of Figure 5. The vacuum tube switching circuit 506 is supplied with modulating waves through the modulation transformer 100 so as to alternately render tubes 508 or 510 conductive, in this way reversing the feedback to the half wave line 504 which is coupled to the line 502. It is to be noted that line 504 corresponds to circuit $C_1$, $L_1$ of Figure 5, and line 502 to the circuit $C_2$, $L_2$ of Figure 5 and that the switch S of Figure 5 has been replaced in Figure 4 by the tube arrangement 506.

The two pairs of tubes 508, 510 form two push-pull coupling stages in which the phase of the grids in one pair is opposite to the phase in the grids of the other pair. As before explained, the plates are connected to a deflector or auxiliary line 504.

When there is no modulation potential in the transformer 100, the system is balanced so that the generator control line receives no energy from the four plates of the tube switching circuit 506. When, however, modulation is supplied, the tubes in which the grids are made more positive will provide a greater coupling than those which are made negative, as a result of which the effect upon the oscillator frequency controlling line 502 is the same as if the reflector 504 had been moved back and forth with respect to it, or is the same as if the inductance and capacity of the line 502 had been simultaneously varied. Preferably, the lines 504, 502 are housed within a shielded compartment or within a metallic cylinder and temperature controlled.

In the prior arrangements, the modulating potentials are applied to the control grids or to the cathodes of the coupling or control tubes between the generator and the frequency control line or circuit. Of course, I contemplate the use of a coupling tube or coupling tubes wherein the control potentials are applied to electrodes of the tube or tubes other than the control grid and cathode. For example, the controlling potentials may be applied to the anodes of a pair of coupling or modulator tubes 68, 70 in phase displaced relation from any source in any manner. For example, the modulating potentials may be applied in phase displaced relation by way of a transformer 100 connected as shown in Figure 6. The control grids of these tubes may be coupled by way of a line 603 terminating in an inductance 606 coupled to an inductance 608 connected between the anodes of the tubes in the oscillator. The oscillator may utilize the principles disclosed in connection with the prior modifications. All that is essential is that the control electrodes of the oscillator be connected with loops 10 and 12 coupled as in the prior modifications to the line 14, 16.

The anodes of the coupling tubes 68 and 70 may be coupled by way of coupling and blocking condensers 600 and 601 and a tuned non-symmetrical circuit NC to an element 92 terminating in a plate 94 located in the field of the line 14. The circuit NC may be tuned to the mean operating frequency of the oscillator as determined by the line 14, 16, i. e., to the frequency of said oscillator and line when no modulating potentials are applied.

In operation, as in the prior modifications, high frequency energy is supplied from the oscillator by way of line 603 to the control grids of tubes 68 and 70. These tubes in turn supply energy to the circuit NC and from said circuit to the element 94. The amplitude and phase of the energy supplied to the element 94 vary in accordance with the amplitude and phase of the modulating potentials, thus producing in the field of 14 energy the phase of which opposes or aids the energy of said field. Plate modulation as thus described is preferable in many cases since it is easy to obtain. Moreover, it has been found that the modulation produced in this manner is substantially linear.

The tendency of the push-push potentials in the output of the tubes 68 and 70 to react on the energy in the push-pull circuit between the grids of tubes 68 and 70 may be eliminated by neutralizing the balanced circuit as described more in detail in connection with my U. S. application Ser. No. 8,447, filed February 27, 1935, now Patent No. 2,101,438 dated December 7, 1937. Preferably this is accomplished by connecting the control grid of each of the tubes 68 and 70 to ground by way of condensers K and an inductance Y. For push-push feedback potentials from the non-symmetrical circuit NC, the two condensers are in parallel as are the capacities of tubes 68 and 70 and form in conjunction with the inductance Y a tuned short circuit for the operating frequencies between each grid and ground, thus establishing the aforementioned balance or neutralizing effect. For push-pull feed-forward, that is from line 603 to the non-symmetrical control circuit NC, the inductance Y is in a neutral zone and does not form a part of the input alternating current circuit.

The frequency modulated energy may be derived from a circuit coupled to the cathodes of the oscillator tubes, as disclosed in Figure 1, or from a circuit coupled to the anodes of the tubes, as disclosed in Figure 6.

In the arrangement shown in Figure 7, a single oscillator tube 700 has its control grid coupled as shown to a point on the line 14 which may be moved. The output of the oscillator 700 may be connected in a tuned circuit 701 coupled to the control grid of a modulator or controlling tube 702. The anode of the tube 702 may be connected to a tuned circuit 704 which is in turn coupled to the elements 92, 94. Any tendency of the coupling or modulator tube 702 to oscillate or operate at a frequency other than the frequency applied from 700 may be neutralized by connecting the neutralizing condenser NO between the anode circuit 704 and the control grid of 702. Plate modulation may be utilized here. Preferably, the anode electrode of the modulator tube 710 is connected as shown to a point on the inductance of the circuit 704. Anode potential may be supplied to both tubes from a rectifier by way of a radio frequency choke RFC. Any radio frequency potentials appearing in the anode circuits of 702 and 710 may be shunted around the rectifier by a bypassing condenser connected as shown. Here, as in the prior modifications, the field of 14 is aided or opposed by high frequency energy. The amount of opposition or aid is determined by the phase and amplitude of the modulating potentials applied to the anode of tube 702, and it is preferable to operate circuit 704 slightly out of tune.

When using extremely wide band frequency modulation, power variations may occur in the oscillator. Since the frequency of line controlled oscillators is only slightly affected by plate voltage variations, the simplest way of compensating for the power variations is to vary the plate voltage of the oscillator in accordance with the modulation.

In Figure 8, I have shown for purposes of illustration a frequency modulator of the type disclosed hereinbefore in which additional means is provided for compensating any tendency of amplitude modulation or power variation especially when operating the system to produce wide swings in frequency. The frequency control line 14, 16 of a quarter wave length and the oscillator 800, 802 and their circuits are somewhat similar to the corresponding elements of Figure 1. Here, however, a plate modulating arrangement similar in some respects to Figure 6, and comprising tubes 804, 806 coupled on the one hand by a line 803 to the anode circuit 805 of the oscillator tubes is used. The anodes of the tubes 804, 806 are coupled by blocking condensers 809 as shown, to a non-symmetrical circuit 810, in turn coupled to the elements 92, 94. Modulating potentials are supplied to the anodes of the tubes 804 and 806 from the secondary winding of transformer 814, the primary winding of which is in the anode circuit of a modulator tube 812. The control grid of the modulator tube may be coupled by way of a transformer 100 to any source of modulating potential. Here, as in the modification illustrated in Figure 6, the phase and amplitude of the energy produced by 94 in the field of 14 vary in accordance with the phase and amplitude of the modulating potentials supplied by the transformer 100. As indicated above, undesired modulations of the oscillations produced in the oscillator and line 14, 16 may occur when extremely wide band modulation power is utilized. To overcome this, a compensating modulator tube 816 has its control grid connected as shown with the secondary winding of transformer 100 and its anode connected as shown to the circuit 805 between the anodes of the modulator stage.

The anode of the compensation modulator tube 816 and the anodes of the oscillator tubes 800 and 802 are connected as shown by way of a low frequency reactor LR to the positive terminal of a source of potential, such as a rectifier R1, the negative terminal of which is connected to the cathodes of the tubes 816, 800 and 802. In this manner, the direct current potentials supplied to the anodes of the oscillator tubes 800 and 802 are controlled to the necessary extent by the modulating potentials to thereby compensate for the variations in power occurring in the oscillators during frequency modulation. If this compensation is not used, too much "off tuning" of the stud circuits will have to be used, and this will render the device less efficient.

Radio frequency oscillations may be prevented from reaching the modulating circuits from the non-symmetrical circuit 810 by radio frequency choking inductances connected as shown between the anodes of 804 and 806 and the secondary winding of 814. By-passing condensers BC1, BC2 may be connected as shown between the choking inductances RFC and ground. Direct current potentials from the electrodes of the modulator tubes, and the amplifier, may be supplied from rectifier sources R2, R3 connected as shown.

In the modification shown in Figure 8, the frequency modulated carrier wave may be derived by way of a circuit coupled to the anode circuit of the oscillator tubes 800, 802 or by way of a circuit coupled to the cathode circuits of the oscillator tubes or by way of circuits coupled to the anode circuit and to the cathode circuit of the oscillator tubes.

Having thus described my invention, what I claim is:

1. A frequency modulation system comprising an oscillator having an output circuit and a frequency controlling circuit, means for applying voltage from said output circuit to said frequency controlling circuit, and means responsive to signaling waves for reversing the phase and varying the amplitude of the applied voltage thereby varying the frequency of oscillations generated by said oscillator.

2. Apparatus as claimed in the preceding claim, characterized by the fact that said output circuit is tuned.

3. In a frequency modulation system, an oscillation generator having a frequency controlling circuit and an output circuit, a capacitive element associated with said frequency controlling circuit, means for feeding back voltages from said output circuit to said capacitive element, and means responsive to signaling waves for reversing the phase and varying the amplitude of the voltages fed to said capacitive element whereby the effective capacitance of said frequency controlling circuit is varied, thereby varying the frequency of the energy appearing in said output circuit.

4. In a frequency modulation system, an oscillation generator having a frequency controlling circuit and an output circuit, a reactive element associated with said frequency controlling circuit, means for feeding back voltages from said output circuit to said reactive element, and means responsive to signaling waves for reversing the phase and varying the amplitude of the voltages fed to said reactive element whereby the effective reactance of said frequency controlling circuit is varied, thereby varying the frequency of the energy appearing in said output circuit.

5. In a frequency modulation system, an oscillation generator having a frequency controlling circuit and an output circuit, an inductive element associated with said frequency controlling circuit, means for feeding back voltages from said output circuit to said inductive element, and means responsive to signalling waves for reversing the phase and varying the amplitude of the voltages fed to said inductive element whereby the effective inductance of said frequency controlling circuit is varied, thereby varying the frequency of the energy appearing in said output circuit.

6. In a frequency modulation system, an oscillator having an output circuit and a frequency controlling circuit consisting of a resonant line, capacitive means for applying voltage from said output circuit to said frequency controlling line, and means responsive to signalling waves for varying the phase and amplitude of the voltage applied from said output circuit to said frequency controlling line, thereby varying the effective capacitance of said line and consequently varying the frequency of oscillations generated by said oscillator.

7. In a frequency modulation system, an oscillator having an output circuit and a frequency controlling circuit consisting of a resonant line, inductive means for applying voltage from said output circuit to said frequency controlling line, and means responsive to signalling waves for varying the phase and amplitude of the voltage applied from said output circuit to said frequency controlling line, thereby varying the effective inductance of said line and consequently varying the frequency of oscillations generated by said oscillator.

8. In a frequency modulation system, an oscillator having an output circuit and a frequency controlling circuit consisting of a resonant line, reactive means for applying voltage from said output circuit to said frequency controlling line and means responsive to signalling waves for varying the phase and amplitude of the voltage applied from said output circuit to said line, thereby varying the effective reactance of said line and consequently varying the frequency of oscillations generated by said oscillator.

9. In a frequency modulator an oscillator having an output circuit, an additional circuit coupled at its input to the output circuit of said oscillator, said additional circuit being coupled at its output to said oscillator, phase reversing means in said additional circuit, and means for controlling said phase reversing means at signal frequency.

10. In a frequency modulator an oscillator having an input circuit and an output circuit, an additional circuit coupled at its input to the output circuit of said oscillator, said additional circuit being coupled at its output to the input circuit of the oscillator, phase reversing means in said additional circuit and means for controlling said phase reversing means at signal frequency.

11. In a frequency modulator, a thermionic oscillator having a frequency determining circuit, an additional circuit coupled at its input to said oscillator, said additional circuit being coupled at its output to said frequency determining circuit, phase reversing means in said additional circuit, and means coupled to said phase reversing means for controlling the same at signal frequency.

12. In signalling systems, an oscillator circuit, frequency control means coupled to said circuit, a coupling circuit coupled at its input to said oscillator circuit and at its output to said frequency control means, and means in said coupling circuit for reversing the phase of the oscillations therein at signal frequency, said coupling circuit being tuned substantially to the frequency to which said oscillator circuit is to operate.

13. In a signalling system, an oscillator circuit, frequency determining means coupled thereto, a coupling circuit coupled at its input to said oscillator and at its output to said frequency determining means, said coupling circuit being tuned at its output to a frequency slightly different than the operating frequency of said oscillator, and thermionic means in said coupling circuit for reversing the phase of the oscillations passed thereby at signal frequency.

14. In a frequency modulator an oscillator of the electron discharge device type having input and output electrodes coupled in oscillation producing circuits, frequency stabilizing means including linear adjacent conductors in one of said circuits, and additional electron discharge system having input electrodes coupled to one of said oscillation producing circuits and having output electrodes coupled to one of said oscillation producing circuits, means for varying the impedance of said additional electron system at signal frequency, and means for tuning said last named coupling to a frequency slightly different than the frequency to which said oscillation producing circuits are tuned.

15. In a frequency modulator, a tube oscillator having input and output electrodes coupled in oscillation producing circuits, a frequency controlling line of the concentric cylinder type in one of said circuits, an electron discharge tube system having input electrodes coupled to the output of said oscillator and having output electrodes capacitively coupled to one element of said frequency controlling line, and means for varying the frequency of operation of said tube oscillator comprising a source of modulating potentials coupled to said electron discharge system.

16. In a frequency modulating system, a pair of thermionic tubes, a frequency controlling element coupled with like electrodes in said tubes, an output circuit coupled with other like electrodes in said tubes, a pair of thermionic modulator tubes, a circuit coupling the input electrodes of said pair of thermionic modulator tubes in push-pull relation to the output circuit of said oscillator tubes, a push-push circuit coupling the output electrodes of said modulator tubes to said frequency controlling element, and a source of modulating potentials connected in phase opposition to like electrodes in said last named tubes.

17. In a frequency modulating system a pair of thermionic tubes, a frequency controlling element coupled with like electrodes in said tubes, an oscillation circuit coupled with other like electrodes in said tubes, a pair of thermionic modulator tubes, a circuit coupling the input electrodes of said pair of thermionic modulator tubes in push-pull relation to said oscillation circuit, a push-push circuit coupling the output electrodes of said modulator tubes to said frequency controlling element, a source of modulating potentials connected in phase opposition to like electrodes in said last named tubes, and a coupling between said source of modulating potentials and the output electrodes of said first named pair of tubes.

18. In a frequency modulating system a pair of thermionic tubes, a frequency controlling element coupled with the control electrodes in said tubes, an output circuit coupled with the output electrodes in said tubes, a pair of thermionic modulator tubes, a circuit coupling the input electrodes of said pair of thermionic modulator tubes in push-pull relation to the output circuit of said oscillator tubes, a reactive circuit coupling the output electrodes of said modulator tubes to said frequency controlling element, a source of modulating potentials connected in phase opposition to the output electrodes in said modulator tubes, and a coupling between said source of modulating potentials and the output electrodes of said first named pair of tubes.

19. In a frequency modulating system a pair of thermionic tubes, a frequency controlling element coupled with like electrodes in said tubes, an output circuit coupled with other like electrodes in said tubes, a pair of thermionic modulator tubes, a circuit coupling the cathodes of said pair of thermionic modulator tubes in push-pull relation to the output circuit of said oscillator tubes, a push-push circuit coupling the output electrodes of said modulator tubes to said frequency controlling element, means for maintaining the control grids of said modulator tubes at ground radio frequency potential, and a source of modulating potentials connected to phase opposition to like electrodes in said last named tubes.

20. In a system for producing oscillations and modulating the frequency of the oscillations at signal frequency, an electron discharge tube having a control grid, a cathode and an anode, an output circuit connected between the anode and cathode, a frequency controlling circuit comprising concentric conductors the length of which is substantially one-quarter the length of the waves to be generated, means connecting one of said conductors to the cathode of said tube, means connecting the other of said conductors to the control grid of said tube, an additional electron discharge tube having its input electrodes coupled to said output circuit and its output electrodes connected in an output circuit, means coupling said last named output circuit to one of said concentric conductors, means for tuning said last named output circuit to a frequency different than the frequency of the oscillations generated in said first named tube and line, and means for modulating the impedance of said last named tube at signal frequency.

21. In a system for producing wave energy of carrier frequency and modulating the frequency of the same through a wide range of frequencies, an electron discharge device having a control grid, a cathode and an anode, a resonant line comprising concentric conductors one of which is of a length at least one-quarter the length of the waves to be generated, a tuned oscillatory circuit connected between the anode and cathode of said tube, a connection between the control grid of said tube and one of said conductors, a connection between the cathode of said tube and the other of said conductors, an additional electron discharge device having a control grid, a cathode and an anode, a circuit connecting the control grid and cathode of said last named tube to said output circuit, an output circuit connected between the anode and cathode of said additional tube, means for tuning said last named output circuit to a frequency different than the frequency of the wave generated by said first named tube, means for coupling said last named output circuit to one of said conductors, means for varying the impedance of said last named tube at signal frequency, and means connected with said last named means for controlling the impedance of said first named tube at signal frequency.

22. In a frequency modulation system, an oscillation circuit including adjacent conductors, means for diverting oscillatory voltage from said circuit, means for reversing the phase and varying the amplitude of the diverted voltage at signal frequency, an element adjacent one of said conductors and energized thereby, and means for impressing the diverted phase reversed and amplitude varied voltage on said element to thereby effect the electric flux from one of said conductors of said oscillation circuit.

23. In a frequency modulation system, an oscillation generator having a circuit in which oscillatory energy flows, said circuit comprising concentric conductors one of which is maintained at substantial oscillating voltage potential, means for diverting voltage from said generator and impressing it on one of said conductors in phase or in phase displaced relation relative to the voltage on said conductor, and means connected with said last named means for reversing the phase of said impressed voltage at signal frequency.

24. A system as recited in claim 23 wherein said one of said conductors is connected by a high impedance to said other of said conductors and in which said last named means operates on said high impedance connecting said conductors.

25. In a frequency modulation system, an electron discharge device having input and output electrodes connected in oscillation producing circuits, a frequency controlling line comprising concentric conductors, one of which is connected to the cathode of said device and the other of which is connected to another electrode of said device, a conductive element coupled to one of said conductors and connected to the other of said conductors by a high impedance, means for applying voltage from one of said circuits connected with said electron discharge device to said conductive element, and means for reversing the phase of the voltage applied to said conductive element in accordance with signals to thereby vary the tune of said line and consequently the frequency of the oscillation generator by said device.

26. A system as recited in claim 25 wherein said last named means also varies the amplitude of the voltage applied to said conductive element in accordance with said signals.

27. A system as recited in claim 23 wherein said last named means also varies the amplitude of the voltages impressed on said one of said conductors in accordance with signals.

28. In a frequency modulation system, an ultrahigh frequency oscillator, frequency control means operably associated with said ultrahigh frequency oscillator to control the frequency of oscillation thereof; means for deriving oscillatory energy produced by said oscillator, means for feeding said derived oscillatory energy to said frequency control means, and means operable at signal frequency for shifting the phase of the energy fed to said frequency control means back and forth between two predetermined limits to control the frequency of oscillation of said oscillator in accordance with said signals.

29. In a frequency modulation system, an ultrahigh frequency oscillator of the electron discharge device type having input and output electrodes coupled in oscillation producing circuits, frequency control means operably associated with said ultrahigh frequency oscillator to control the frequency of oscillation thereof, electron discharge tube means for deriving oscillatory energy from said oscillator, means for feeding said derived oscillatory energy from said electron discharge tube means to said frequency control means, and means for controlling the impedance of said electron discharge tube in accordance with signals for shifting the phase of the energy fed to said frequency control means back and forth between two predetermined limits to control the frequency of oscillation of said oscillator in accordance with said signals.

30. In a frequency modulation system, an oscillation generator including electron discharge devices having input and output electrodes connected in oscillation producing circuits, a frequency control means in the form of concentric lines coupled with one of said circuits, and means for modulating the frequency of the oscillations produced comprising a pair of electron discharge tubes having input electrodes coupled in push-pull relation with one of said oscillation producing circuits, said electron discharge tubes having output electrodes, a circuit of substantial impedance to the oscillations generated coupling the output electrodes of said tubes to one of said concentric lines, a source of modulating potentials and circuits for impressing said modulating potentials in phase opposition on the output electrodes of said discharge tubes.

31. In a frequency modulation system, an electron discharge device having input and output electrodes coupled in oscillation producing circuits, frequency controlling means in one of said circuits including concentric lines, and means for controlling the reactance of one of said lines at signal frequency to thereby control the frequency of the oscillations produced at signal frequency including an electron discharge tube having input electrodes coupled to one of said circuits, said tube having output electrodes, a tuned circuit of material impedance to the oscillations produced in said device and circuits coupling the output electrodes of said tube to one of said lines, a modulator tube having output electrodes connected in shunt to the electrodes in said tube, and a source of modulating potentials for varying the impedance of said modulator tube at signal frequency.

32. In combination, an oscillation generator having a frequency determining circuit, a pair of electron discharge circuits for varying the frequency of oscillations generated by said generator, each of said discharge circuits having an anode, a cathode and a control electrode, means feeding waves from the generator in phase opposition to the control electrodes of said discharge circuits, means for feeding control waves of varying potential in phase opposition to said control electrodes, and means connecting the anodes of said discharge circuits together and coupling the same to said frequency determining circuit.

33. In a variable frequency system, a thermionic oscillator having a frequency determining circuit, an additional circuit coupled at its input to said oscillator, said additional circuit being coupled at its output to said frequency determining circuit, phase reversing means and an off-tuned circuit in said additional circuit, and means coupled to said phase reversing means for controlling the same at signal frequency, said phase reversing means comprising a pair of electron discharge systems, means for varying the impedance of said systems in phase opposition with waves derived from said oscillator, means for additionally varying the impedance of said systems in opposition with waves of signal frequency, means for connecting output electrodes of said systems together, and means for coupling said output electrodes so connected to said frequency determining circuit.

34. In a variable frequency system, a vacuum tube for generating high frequency oscillations, a circuit coupled thereto and carrying oscillatory waves the frequency of which are to be varied, a pair of electron discharge paths having electron emitting and electron receiving electrodes, means oppositely varying the conductivity of said paths with waves of the same frequency as the frequency of waves carried by said circuit, a source of control waves, means oppositely varying the conductivity of the paths with control waves from said source; means effectively connecting the electron receiving electrodes of said paths effectively directly together, and means connecting said connected receiving electrodes to said circuit whereby the frequency of said oscillatory waves vary in direction and amount in accordance with respectively, the polarity and amplitude of said control waves.

35. In combination, an oscillation generator having a frequency controlling circuit, a pair of frequency varying electron discharge circuits each having an anode, a cathode and a control electrode, means feeding waves from the generator in phase opposition to the control electrodes of said discharge circuits, means for feeding control waves of varying potential in phase opposition to said control electrodes, low impedance means connecting said anodes together and capacity coupling means coupling the connected anodes to said frequency determining circuit.

36. In a frequency varying system, a thermionic oscillator having a frequency determining circuit, an additional circuit coupled at its input to said oscillator, said additional circuit being coupled at its output to said frequency determining circuit, phase reversing means in said additional circuit, and means coupled to said phase reversing means for controlling the same at signal frequency, said phase reversing means comprising a pair of electron discharge systems, means for varying the impedance of said systems in phase opposition with waves derived from said oscillator, means for additionally varying the impedance of said systems in opposition with waves of signal frequency, and means for connecting output electrodes of said systems together and to said frequency determining circuit.

37. In a variable frequency system, a vacuum tube arrangement having input and output circuits said output circuit carrying high frequency oscillations to be varied in frequency, and means interconnecting said circuits whereby the frequency of the oscillations in and carried by said output circuit is varied comprising a pair of electron discharge paths each having emitting, control and electron receiving electrodes, means connecting said electron receiving electrodes directly together, means connecting said connected electrodes to said output circuit; means feeding waves, of a frequency carried by said vacuum tube arrangement, in phase opposition to like control electrodes of said paths; and means oppositely varying the conductivity of said paths with signal waves whereby the frequency of oscillations in said output circuit is varied in direction and amount depending respectively upon the polarity and amplitude of the signal waves.

38. In combination, an oscillation generator having a frequency determining circuit, a pair of frequency varying tubes each having an anode, a cathode and a control electrode, means feeding waves from the generator in phase opposition to the control electrodes of said tubes, means for feeding signal waves of varying potential in phase opposition to control electrodes of said tubes, and means connecting the plates of said tubes together and coupling the same to said frequency determining circuit whereby waves are fed through said frequency varying tubes to said generator of a phase which reverses as the polarity of the signal waves reverses and of an amplitude which varies in accordance with the amplitude of the signal waves.

39. In a frequency modulation system, a thermionic oscillator having a frequency determining circuit, an additional circuit coupled at its input to said oscillator, said additional circuit being coupled at its output to said frequency determining circuit, phase reversing means in said additional circuit, and means coupled to said phase reversing means for controlling the same at signal frequency, said phase reversing means comprising a pair of electron discharge systems, means for varying the impedance of said systems in phase opposition with waves derived from said oscillator, means for additionally varying the impedance of said systems in opposition with waves of signal frequency, and means for connecting output electrodes of said systems together and to said frequency determining circuit.

40. In combination, a regenerative oscillation generator having a frequency determining circuit having inductance and capacity, a pair of frequency varying tubes each having an anode, a cathode, and a control electrode, means feeding waves from the generator in phase opposition to the control electrodes of said tubes, means for feeding control waves of varying potential in phase opposition to control electrodes of said tubes, means connecting the anodes of said tubes directly together, and means coupling the connected anodes to said frequency determining circuit.

41. A variable frequency system comprising an oscillator having a frequency determining circuit having inductance and capacity, an additional circuit coupled at its input to said oscillator, said additional circuit being coupled at its output to said frequency determining circuit, phase reversing means in said additional circuit, a source of control voltage, and means coupled to said phase reversing means and to said source of control voltage for controlling the same, said phase reversing means comprising a pair of electron discharge systems, means for varying the impedance of said systems in phase opposition with waves derived from said oscillator, means for additionally varying the impedance of said systems in opposition with control voltages derived from said source of control voltages, and means for connecting output electrodes of said systems together and through capacity to said frequency determining circuit.

42. In a frequency varying system, an oscillation generator whose frequency is to be varied, a frequency controlling circuit for said generator, a pair of thermionic modulator tubes, means for subjecting input electrodes of said pair of tubes in push-pull relation to waves from said oscillation generator, means including inductance for coupling the output electrodes of said tubes in push-push to said frequency determining system, a source of control waves, and means connected to said source and coupled to like electrodes of said tubes for oppositely varying the conductivity of said tubes.

43. In a frequency varying system, an oscillation generator whose frequency is to be varied, a frequency controlling circuit for said generator, a pair of thermionic modulator tubes, means for applying to input electrodes of said pair of tubes in push-pull relation, waves from said oscillation generator, means connecting the output electrodes of said tubes directly together, means including inductance for connecting the connected output electrodes of said tubes in push-push to said frequency determining system, and a source of control waves connected in phase opposition to like electrodes in said tubes.

44. In a frequency varying system, an oscillation generator whose frequency is to be varied, a frequency controlling circuit for said generator, a pair of thermionic modulator tubes, means for varying input electrodes of said pair of tubes in push-pull relation with waves from said oscillation generator, means connecting the output electrodes of the tubes directly together, and means including capacity for coupling the connected output electrodes of said tubes in push-push to said frequency determining system, a source of control waves, and means connected to said source and coupled to like electrodes of said modulator tubes for varying the conductivity of said tubes oppositely with waves from said source.

45. In a frequency varying system, an oscillation generator whose frequency is to be varied, a frequency controlling circuit for said generator, a pair of thermionic modulator tubes, means for varying input electrodes of said pair of tubes in push-pull relation with waves from said oscillation generator, means including capacity for connecting the output electrodes of said tubes in push-push to said frequency determining system, and a source of control waves connected in phase opposition to like electrodes in said tubes.

46. In a high frequency signaling system, an oscillation generator comprising an electron discharge device having a control grid, an anode and a cathode connected in oscillation generating circuits, a frequency modulation tube having input and output electrodes, means coupling the input electrodes of said modulator tube to said generating circuits, a tuned reactance coupling the output electrodes of said tube to said generating circuits to vary the frequency of oscillations generated in accordance with the strength of current flowing in said tuned reactance, means for neutralizing the capacity between the input and output electrodes of said tube, and means for modulating the impedance of said modulator tube at signal frequency to vary the current flow in said tuned reactance.

47. In combination, an oscillation generator comprising an electron discharge device having a control grid, an anode and a cathode connected in oscillation generating circuits, a frequency varying tube having input and output electrodes, means coupling the input electrodes of said frequency varying tube to said generating circuits, means coupling the output electrodes of said frequency varying tube to said generating circuits to vary the frequency of oscillations generated in accordance with the strength of current flowing in said frequency varying tube, one of said coupling means comprising a parallel tuned circuit, means preventing self-oscillation of said frequency varying tube, and means for varying the impedance of said frequency varying tube with control voltages to vary the current flow through said frequency varying tube.

48. In a high frequency signaling system, an oscillation generator comprising an electron discharge device having a control grid, an anode and a cathode connected in oscillation generating circuits, a frequency modulation tube having input and output electrodes, means coupling the input electrodes of said modulator tube to said generating circuits, a tuned reactance comprising capacity and inductance in shunt relationship coupling the output electrodes of said tube to said generating circuits to vary the frequency of oscillations generated in accordance with the strength of current flowing in said tuned reactance, means for preventing self-oscillation of said tube, and means for modulating the impedance of said modulator tube at signal frequency to vary the current flow in said tuned reactance.

49. In combination, an oscillation generator having a frequency determining circuit, an alternating current circuit fed with waves from said generator, a vacuum tube system coupled to said alternating current circuit for amplifying the waves fed from the generator to said circuit, a source of control waves for varying the conductivity of said tube system, a circuit for feeding waves amplified by said tube system to said frequency determining circuit whereby the frequency of waves generated by said generator is varied in accordance with said control waves, and means for simultaneously amplitude varying the waves generated by said oscillation generator in dependence upon said control waves so as to compensate for amplitude changes introduced by said vacuum tube frequency varying system.

50. In combination, an oscillation generator having a frequency determining circuit, a pair of electron discharge paths, means for feeding waves from said generator to said discharge paths, means for feeding amplified waves from said discharge paths to said frequency determining circuit, a source of control potentials, means for oppositely varying the conductivity of said paths with potentials from said control source whereby the frequency of oscillations generated by said generator is varied in direction in accordance with the polarity of said control potentials and in amount in accordance with the amplitude of said control potentials, and means for simultaneously varying the amplitude of oscillations generated by said generator so as to compensate for amplitude changes produced by said discharge path system.

51. In combination, an oscillation generator having a frequency determining circuit, a circuit fed with waves from said generator, a vacuum tube system coupled to said last-named circuit amplifying waves fed to said circuit, a source of control waves for varying the conductivity of said tube system, a tuned circuit for feeding waves amplified by said tube system to said frequency determining circuit whereby the frequency of waves generated by said generator is varied in accordance with said control waves, and means for preventing self-oscillation of said vacuum tube system.

52. Apparatus as claimed in the preceding claim, characterized by the fact that said vacuum tube system comprises a pair of electron discharge paths excited in phase opposition by said circuit fed with waves from said generator, and being further characterized by the fact that the conductivity of said paths is varied in phase opposition with control waves.

53. In combination, an oscillation generator having a frequency determining circuit having inductance and capacity, a pair of electron discharge paths, means for feeding waves from said generator to said paths to vary the conductivity of said paths in phase opposition, a source of control waves, means for feeding control waves to said paths to vary the conductivity thereof in phase opposition, means for combining the outputs of the paths and feeding the outputs of said paths in parallel to said frequency determining circuit whereby the frequency of oscillations generated by said generator is varied in accordance with said control waves.

54. In combination, an oscillation generator having a frequency determining circuit, a circuit fed with waves from said generator, a vacuum tube system coupled to said last-named circuit amplifying waves fed to said circuit, a source of control waves for varying the conductivity of said tube system, a circuit for feeding waves amplified by said tube system to said frequency determining circuit whereby the frequency of waves generated by said generator is varied in accordance with said control waves, and means for simultaneously amplitude modulating waves in said oscillation generator with said control waves in such a way as to compensate for amplitude changes produced by said vacuum tube frequency varying system.

55. In combination, an oscillation generator having a frequency determining circuit, a pair of electron discharge paths, means for feeding waves from said generator to said discharge paths, means for feeding amplified waves from said discharge paths to said frequency determining circuit, a source of control potentials, means for oppositely varying the conductivity of said paths with potentials from said control source whereby the frequency of oscillations generated by said generator is varied in direction in accordance with the polarity of said control potentials and in amount in accordance with the amplitude of said control potentials, and means for simultaneously varying the amplitude of oscillations generated by said generator with waves from said control potential source so as to compensate for amplitude changes produced by said discharge path system.

56. In combination, an oscillation generator having a frequency determining circuit, a circuit fed with waves from said generator, a vacuum tube system coupled to said last-named circuit, said vacuum tube system amplifying waves in said circuit fed by said generator, a source of control waves for varying the conductivity of said tube system, a parallel tuned circuit for feeding waves amplified by said tube to said frequency determining circuit whereby the frequency of waves generated by said generator is varied in accordance with said control waves, and means for preventing self-oscillation of said vacuum tube system.

57. Apparatus as claimed in the preceding claim, characterized by the fact that said vacuum tube system comprises a pair of electron discharge paths excited in phase opposition by said circuit fed with waves from said generator, and being further characterized by the fact that the conductivity of said paths is varied in phase opposition with said control waves.

58. A frequency modulation transmitting system comprising, an oscillation generator having a frequency determining circuit having inductance and capacity, a pair of electron discharge systems, means for feeding waves from said generator to said systems to vary the conductivity of said systems in phase opposition, a source of modulating waves, means for feeding modulating waves from said source to said discharge systems to vary the conductivity thereof in phase opposition, means for combining the outputs of the discharge systems and feeding the outputs of said discharge systems in parallel to said frequency determining circuit whereby the frequency of oscillations generated by said generator is varied in accordance with said modulating waves.

59. In combination, an oscillation generator having a frequency determining circuit, a pair of electron discharge paths, means for feeding waves from said generator to said discharge paths, means for feeding amplified waves from said discharge paths to said frequency determining circuit, a source of control potentials, and means for oppositely varying the conductivity of said paths with potentials from said control source whereby the frequency of oscillations generated by said generator is varied in direction in accordance with the polarity of said control potentials and in amount in accordance with the amplitude of said control potentials.

60. A transmitter for transmitting waves varied in frequency in accordance with signal modulating voltages comprising a regenerative oscillation generator having a frequency determining circuit having inductance and capacity, a pair of frequency varying discharge systems each having an anode, a cathode and a control electrode, means feeding waves from the generator in phase opposition to the control electrodes of said frequency varying systems, means for feeding signal modulating voltages in phase opposition to control electrodes of said discharge systems, means connecting the anodes of said systems directly together, means coupling the connected anodes to said frequency determining circuit whereby to vary the frequency of oscillations generated by the generator in direction in accordance with the polarity of the signaling potentials and in amount in accordance with the amplitudes of said signaling potentials, and an output circuit coupled to said generator for transmitting the generated and frequency varied waves.

61. A transmitter for transmitting waves varied in frequency in accordance with signal potentials comprising an oscillation generator having a frequency determining circuit, a pair of electron discharge paths, means for feeding waves from said generator to said discharge paths for oppositely varying the conductivity thereof, a source of signal potentials, means for oppositely varying the conductivity of said paths with potentials from said source of signaling potentials whereby the frequency of oscillations generated by said generator is varied in direction in accordance with the polarity of said signaling potentials and in amount in accordance with the amplitude of said control potentials, and a transmitting output circuit coupled to said generator fed with waves of varied frequency derived from said generator.

62. In a system for producing waves of varied frequency, an oscillation generator having an output circuit and a frequency controlling circuit comprising a hollow metallic enclosure containing electric flux varying at high frequency, a metallic element within said enclosure, a source of control voltages, and means connected to said source and to said element for changing the electric flux distribution within said container and thereby the frequency of oscillation of said generator in accordance with the amplitude and polarity of said control voltages.

63. In a frequency varying system for producing oscillations of variable frequency, an oscillation generator having an output circuit and a frequency controlling circuit comprising a hollow metallic enclosure containing electro-magnetic flux varying at high frequency, an element within said enclosure, a source of control voltages, and means connected to said source and responsive to voltages therefrom for subjecting said element to waves produced by said generator of such phase and amplitude as to alter the electro-magnetic flux distribution within said container and thereby vary the frequency of oscillations generated by said generator in accordance with said control voltages.

NILS E. LINDENBLAD.